United States Patent [19]
Misium et al.

[11] Patent Number: 6,140,024
[45] Date of Patent: Oct. 31, 2000

[54] REMOTE PLASMA NITRIDATION FOR CONTACT ETCH STOP

[75] Inventors: George R. Misium, Plano; Sunil V. Hattangady, McKinney, both of Tex.

[73] Assignee: Texas Instruments Incorporated, Dallas, Tex.

[21] Appl. No.: 09/216,145

[22] Filed: Dec. 18, 1998

Related U.S. Application Data

[60] Provisional application No. 60/070,296, Dec. 31, 1997.

[51] Int. Cl.⁷ ........................................................ G03C 5/00
[52] U.S. Cl. ............................................ 430/314; 430/316
[58] Field of Search ..................................... 430/314, 313, 430/316

[56] References Cited

U.S. PATENT DOCUMENTS

| | | | |
|---|---|---|---|
| 4,620,361 | 11/1986 | Matsukawa et al. | 430/314 |
| 5,143,820 | 9/1992 | Kotecha et al. | 430/314 |

*Primary Examiner*—Christopher G. Young
*Attorney, Agent, or Firm*—Jacqueline J. Garner; Wade James Brady, III; Frederick J. Telecky, Jr.

[57] ABSTRACT

A method is disclosed of nitridating an oxide layer (12) to form a stop layer for selective etching of sacrificial layer comprising the steps of, obtaining a wafer (10), forming a gate (30) on the wafer (10), depositing an oxide layer (12) on the wafer (10) and the gate (30), exposing the surface of the oxide layer (12) to a nitrogen ion containing plasma at, e.g., room temperature, wherein the nitrogen ions form a nitrided layer (22) on the oxide layer (12). Next, a silicate layer (32) is deposited on the nitrided layer (22), planarized and patterned with photoresist (14) for etching. The contacts or vias are then formed through the silicate layer (32) by etching down to the nitrided layer (22) that acts as a stop layer, followed by a second etching step that removes the nitrided layer (22). The photoresist (14) is then stripped and the silicon oxide layer (12) etch down to the wafer (10). The process of the present invention prevents the exposure of the wafer (10) to contaminants from the photoresist layer (14) and the etch chemicals that can deposit reactive radicals. These reactive radicals, also known as mobile ions, decrease the reliability of the device by contaminating subsequent layers or structures.

22 Claims, 3 Drawing Sheets

REMOTE PLASMA NITRIDATION FOR CONTACT ETCH STOP

This application claims priority under 35 USC § 119 (e)(1) of provisional application number 60/070,296, filed Dec. 31, 1997.

TECHNICAL FIELD OF THE INVENTION

The present invention relates in general to the field of integrated circuit manufacturing, and more particulary, to the formation of a thin film of nitride by using a nitrogen plasma to allow selectively etching of layers during the formation of integrated circuit components.

BACKGROUND OF THE INVENTION

Without limiting the scope of the invention, its background is described in connection with the manufacture and formation of integrated circuit components for use in the creation of metal oxide semiconductors, as an example.

Heretofore, in this field, the major steps in silicon wafer fabrication have been the use of diffusion, metallization, etching and chemical clean-up steps to form semiconductors. The introduction of thermal oxidation of silicon, the use of lithographic photoresist techniques and etching of the various components using specific and non-specific chemical agents brought forth the era of the planar processing of semiconductor integrated circuits.

More recently, complementary metal oxide silicon devices (CMOS) have been formed by the growth, deposition and etching of conductive and non-conductive layers taking advantage of chemical-vapor deposition (CVD) and ion implantation techniques. Chemical vapor deposition allowed for the selective and non-selective deposition of, e.g., etch protective overcoats, and of masking material.

In addition to CVD, other common ways for the deposition of conducting or insulation thin films has been the use of vacuum deposition or sputtering. Vacuum deposition and sputtering coat the wafer with a thin film which can, e.g., form an inorganic insulating material when heated in a reactive atmosphere. All three techniques can be used to achieve the deposition of a conducting or insulating layer. The deposited layers may also be used as sacrificial layers for use in the selective etching and formation of an integrated circuit component.

SUMMARY OF THE INVENTION

It has been found, however, that present methods for integrated circuit design and manufacture using silicon nitride layers account for a significant portion of the thermal budget during wafer processing. The thermal budget must be lowered to, e.g., enable scaling of high density integrated circuits. In addition, the large number of high temperature processing steps cause a significant impact on energy consumption and environmental impact of the current methods. The use of large amounts of chemical etching agents to remove these sacrificial layers can contribute to device failure (due, e.g., to mobile ions in the etching agents).

It has also been found that unlike etching processes for contacts of the prior art, the process of the present invention prevents the exposure of the wafer to contaminants from the photoresist layer and the etch chemicals that can deposit reactive radicals. These reactive radicals, also known as mobile ions, decrease the reliability of the device by contaminating subsequent layers or structures. The photoresist layer can be removed, e.g., with a standard piranha or nanostrip, followed by gate clean-up step of HF and SC1, without exposing the surface of the silicon wafer to contamination from the photoresist stripping.

Furthermore, the deposition of thick silicon nitride layers can be required when deep etching of surrounding area is to be accomplished. Due to the thermal expansion of the layer during high temperature steps, mechanical stress resulting from the thick silicon nitride layer can lead to device failure.

What is needed is an improved method for the formation of a nitride layer for a contact etch stop, but that, does not require a high temperature deposition step. Also, a need has arisen for a nitride layer that can be selectively deposited without affecting a photoresist layer. Also needed, is a thinner layer (to lessen the mechanical stress otherwise caused within a thick layer at high temperatures). The layer, however, preferably still should be an effective barrier against mobile ions, and be easily removed in subsequent steps when used as a sacrificial layer. Preferably, this is a low temperature method of forming an opening through an oxide layer down to a silicon wafer without exposing the wafer surface to contamination from photoresist stripping.

The present invention provides an improved method for creating a nitrided silicon layer, or nitrided layer, which is resistant to oxide etching agents but does not require a high temperature deposition step. Using the present invention a nitrided layer can be selectively deposited without affecting a photoresist layer. The method of the present invention can also allow for the deposition of a thin layer that lessens the mechanical stress caused within the layer at high temperatures. The silicon nitrided layer of the present invention can provide an effective barrier against, e.g., mobile ions. The silicon nitrided layer can be easily removed during subsequent steps when used as, e.g., a sacrificial layer.

More particulary, the present invention is directed to a low temperature method of forming an etch stop layer on an oxide containing surface comprising the steps of, obtaining a substrate, depositing an oxide layer on the substrate that has on it an oxide layer having a top surface, and exposing the oxide containing surface to nitrogen ions created by a remote plasma, wherein the nitrogen ions form a nitrided layer on the oxide containing surface for form a nitrided layer that is resistant to etching agents. Preferable also, this is a low temperature method of forming an opening through an oxide layer down to a silicon wafer without exposing the wafer surface to contamination from photoresist stripping.

In one embodiment, a low temperature method of nitridating an oxide containing surface comprises the steps of, obtaining a substrate, growing an oxide layer on the substrate, said oxide layer having a surface and exposing the oxide containing surface to a nitrogen ion containing plasma, wherein the nitrogen ions form a nitrided layer on the oxide containing surface that can be used to protect layers underneath the nitridated layer from, for example, selective etching agents.

More particularly, the oxide containing surface can be further defined as a silicon oxide layer, the oxide containing surface being at a temperature below 600 degrees Celsius, and in one embodiment the temperature is room temperature. The nitrogen ion plasma can be created by a remote plasma.

The method of the present invention may further comprising the step of lithographically developing a resist layer on the oxide containing surface prior to exposing the oxide containing surface to a nitrogen ion containing plasma. Alternatively, one can lithographically develop a resist layer on the oxide containing surface after exposing the oxide containing surface to a nitrogen ion containing plasma.

The step of exposing the oxide containing surface to a nitrogen ion containing plasma (remote plasma nitridation or RPN) preferably occurs at between about 4 and 12 mTorr, and in one embodiment may be, for example, at about 4 mTorr. The step of exposing the oxide containing surface to a nitrogen ion containing plasma can also be defined as occurring for between about 10 to 90 seconds, in one embodiment the exposure occurring for about 60 seconds. In yet another embodiment, the oxide containing surface can be exposed to a nitrogen ion containing plasma at between about 1000 and 3000 watts. In one embodiment the nitrogen ion containing plasma can be created at about 2000 watts. In yet another embodiment, the rate of formation of the nitrided oxide layer is dependent on a substrate bias, where the rate of nitrogen ion implantation into the silicon substrate depends on the voltage difference between the substrate and the plasma.

More particularly, the present invention is a low temperature method of forming an opening through an oxide layer down to a silicon wafer without exposing the wafer surface to contamination from photoresist stripping comprising the steps of, obtaining an oxide containing surface and exposing said oxide containing surface to a nitrogen ion containing plasma, wherein the nitrogen ions form a nitrided layer on the oxide containing surface that is resistant to selective etching. Next, a photoresist is patterned over the nitrided surface and the nitrided surface is etched. Finally, the photoresist is stripped and following removal of photoresist contaminants the remaining oxide at the bottom of the opening is etched.

An alternative embodiment of the invention is a low temperature method of forming an opening through an oxide layer down to a silicon wafer without exposing the wafer surface to contamination from photoresist stripping comprising the steps of, obtaining a substrate and forming a first oxide layer on the substrate, the oxide layer having a surface. The surface is exposed to nitrogen ions created by a remote plasma, wherein the nitrogen ions form a nitrided layer on the oxide surface that is resistant to selective etching agents.

In an alternative embodiment the invention is a low temperature method of forming an etch stop layer on an oxide containing surface comprising the steps of, obtaining a substrate and depositing an oxide layer on the substrate. The surface of the oxide layer is exposed to nitrogen ions created by a remote plasma. The nitrogen ions form a nitrided layer on the surface of the oxide that is resistant to etching agents. Next, a silicate layer is deposited on the nitrided surface layer followed by the patterning of a photoresist. The photoresist pattern is used to form contacts or vias by dry etching the silicate layer to the nitrided layer; and wet etching the nitrided layer, removal of the photoresist, and etching of the oxide layer to the substrate.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is directed to a process for contact etch stop formation by rendering a top portion of a silicon dioxide layer resistant to etch chemistries used in integrated circuit component manufacturing, such as, hydrofluoric acid (HF). Remote plasma nitridation is used to selectively nitridate or nitridize a thin top layer of a silicon dioxide layer. The remote plasma nitridation may form, in situ, a "silicon nitride", which is to be understood as including a heterogenous mixture of silicon nitride ($Si_3N_4$) and silicon oxynitride ($SiNO_x$)

One embodiment is the use of a remote plasma nitridation to cover the surface of the silicon dioxide layer with a nitrided layer prior to the application of a lithographic photoresist layer. The photoresist then serves as a masking layer to protect portions of the nitridized areas during a nitride removal etch. The photoresist is then stripped and the patterned nitride used as a mask for an oxide etch to open the contact via.

Figure 1A:
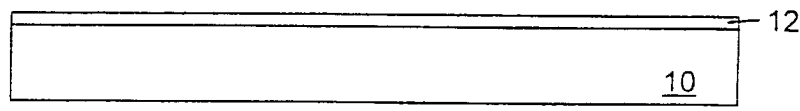
FIGS. 1a–e are illustrative cross-sections of one embodiment of the method of the present invention.
Figure 1B:
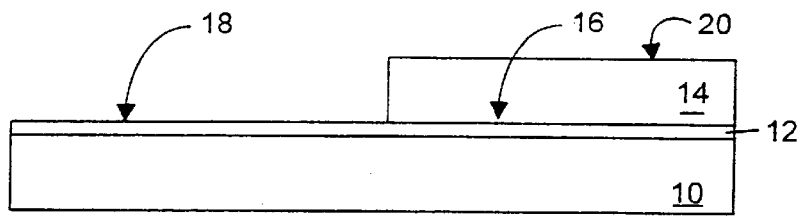
Figure 1C:
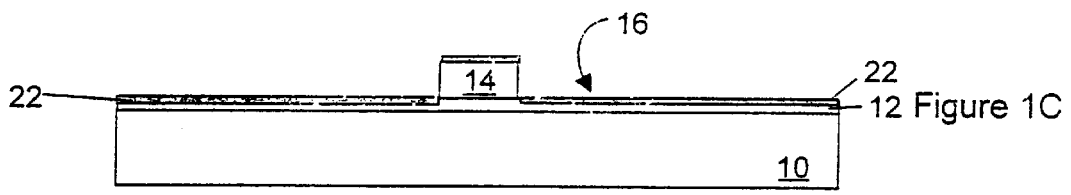

The general features of one embodiment of a remote plasma nitridation method are shown in FIGS. 1a–c. A portion of a wafer 10 on which a silicon dioxide layer 12 has been formed is illustrated FIG. 1a. The wafer 10 is typically a single crystal silicon substrate. The silicon dioxide layer 12 is grown over the wafer 10 by a high temperature processing step in an oxidating environment.

Figure 1D:
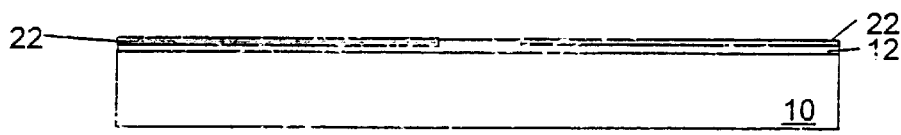
Figure 1E:
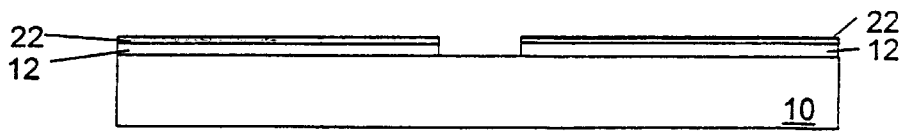

Next, as shown in FIG. 1b, a photoresist layer 14 is shown patterned on a portion of the surface 16 that will not be exposed to the remote plasma nitrogen ions. The surface 18 of the silicon dioxide layer 12 and the top surface 20 of the photoresist layer 14 are then exposed, as shown in FIG. 1c, to a nitridating atmosphere created in a remote plasma nitridation chamber (not shown), causing the surface of the silicon dioxide layer 12 to be nitridated to form nitrided layer 22. In FIG. 1d, the photoresist layer 14 has been removed and in FIG. 1e the oxide 12 has been etched to open a contact via down to the silicon wafer 10. It can be seen that exposure of the silicon wafer 10 to the photoresist 14 during stripping has been avoided.

Unlike etching processes for contacts of the prior art, the process of the present invention prevents the exposure of the wafer 10 to contaminants from the photoresist layer 14 and the etch chemicals that can deposit reactive radicals. These reactive radicals, also known as mobile ions, decrease the reliability of the device by contaminating subsequent layers or structures. The photoresist layer 14 can be removed, e.g., with a standard piranha or nanostrip, followed by gate clean-up step of HF and SC1, without exposing the surface of the silicon wafer 10 to contamination from the photoresist stripping.

Figure 2A:
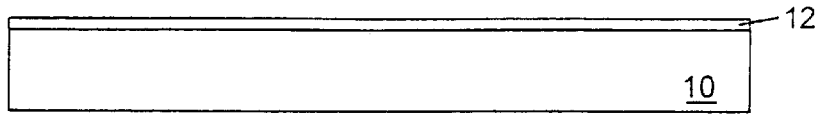
FIGS. 2a–e are illustrative cross-sections of another embodiment of the method of the present invention.
Figure 2B:
Figure 2C:
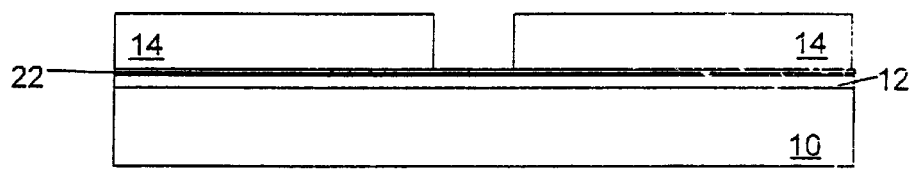

An alternative method using remote plasma nitridation is shown in FIGS. 2a–c. FIG. 2a shows a portion of a wafer 10 on which a silicon dioxide layer 12 has been grown (or partially grown and partially deposited).

Figure 2D:
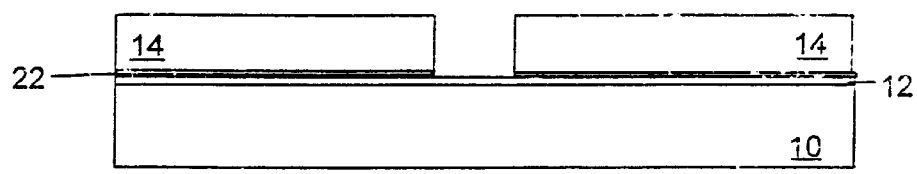
Figure 2E:
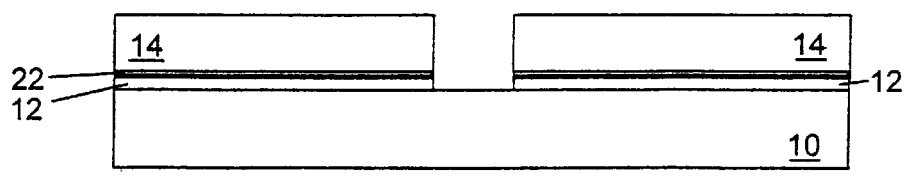

A nitrided layer 22 is created on the entire surface of the silicon dioxide layer 12 as shown in FIG. 2b. Next, a photoresist layer 14 is patterned to cover a portion of the nitrided layer 22 as shown in FIG. 2c. Next, etching chemicals that are capable of etching nitrided portions of the oxide, (but that do not completely affect the photoresist layer 14), are applied to remove the exposed portion of the nitrided layer 22 over the silicon dioxide layer 12. FIG. 2d shows the photoresist layer 14 removed, and the portion of the nitrided layer 22 that was under the photoresist layer 14 still contains the nitrided surface that is resistant to HF chemistry etchants, while the exposed portion of the nitrided layer 22 was etched away, leaving bare oxide. Again, as in the first embodiment, it can be seen that exposure of the silicon wafer 10 to the photoresist 14 during stripping has been avoided.

Figure 3A:
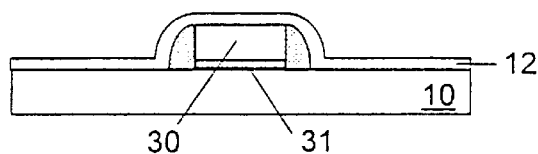
FIGS. 3a–f are illustrative cross-sections of one embodiment of the method of the present invention.
Figure 3B:
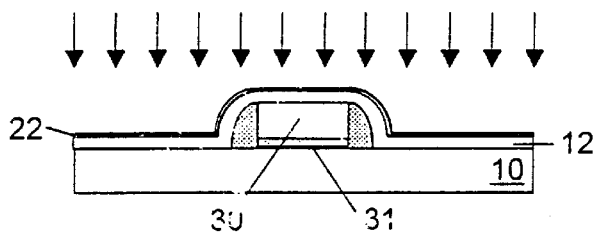
Figure 3C:
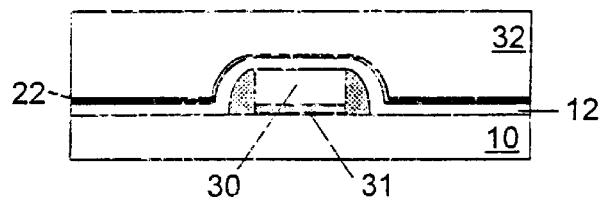

FIGS. 3a–e are illustrative cross-sections of one embodiment the use of the RPN process to create a contact and via stop layer. A gate 30 is made over a gate oxide 31 on a portion of a wafer 10. A silicon dioxide layer 12 is deposited on the gate 30 and the wafer 10. The silicon dioxide layer can be deposited using CVD or plasma enhanced CVD (PECVD), e.g., a plasma enhanced deposition of tetraethoxysilane (PETEOS). A nitrided layer 22 is formed on the entire surface of the silicon dioxide layer 12 as shown in FIG. 3b.

Figure 3D:
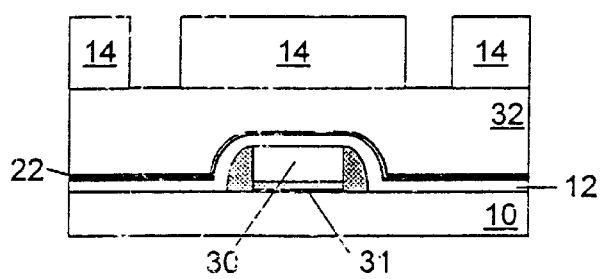

The nitrided layer 22 can be created in, for example, a 30 second exposure to a remote plasma containing nitrogen ion created using 2000 watts of power. Next, a glass silicate layer 32 is deposited to cover the nitrided layer 22 as shown in FIG. 2c. Examples of silicates include borosilicate glass (BSG), phosphosilicate glass (PSG), borophosphosilicate glass (BPSG). The thickness of the silicate layer 32 can vary depending on the actual integrated circuit being made, as will be known to those of skill in the art. For example, the thickness of the silicate layer 32 can be between about 1000 and about 10,500 angstroms. One advantage of depositing a silicate layer 32 of about 10,500 angstroms is that the wafer can be planarized by chemical-mechanical polishing to about 1000 angstroms. A photoresist 14 is patterned on the silicate layer 32 to provide protection from subsequent etching steps as shown in FIG. 3d.

Figure 3E:
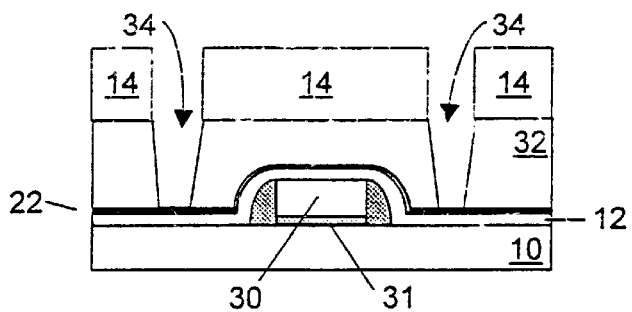

Following the patterning of photoresist 14, openings 34 for contacts or vias are etched to the nitrided layer 22 as depicted in FIG. 3e. In this embodiment, the nitrided layer 22 serves to stop or greatly slow down the etching process, depending on the etchant selected and the timing of the etch. The photoresist 14 can be removed before a short anneal step. One such anneal step can be a rapid thermal anneal carried out at 950 degrees Celsius for 30 seconds.

Etching chemicals that are capable of etching through the nitrided layer 22 and the underlying silicon dioxide 12 are applied to increase the size of the opening 34 so as to reach the surface of the wafer 10. These etching conditions can vary, but in one example can be a wet etch step having a 100 second exposure to buffered hydrofluoric acid. The photoresist 14 can, alternatively, then be stripped after the nitrided layer 22 is selectively etched, but before the underlying silicon dioxide layer 12 is etched, and thus, before the bare silicon on wafer 10 is exposed.

Figure 3F:
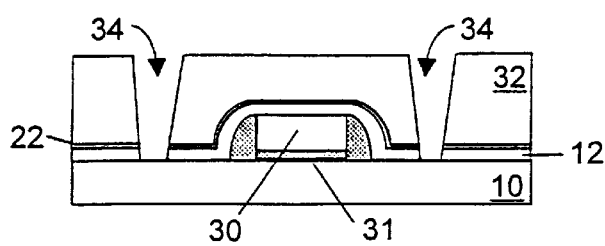

FIG. 3f shows the opening 34 down to the wafer 10. It can be seen that exposure of the silicon wafer 10 to the photoresist 14 during stripping has been avoided.

Alternatively, additional layers can be deposited and protected by the RPN and photoresist process. Additional layers, such as polysilicon and amorphous silicon layers (not depicted) can be deposited and protected using the RPN process disclosed herein. Furthermore, the nitridation step introduces nitrogen in the oxide-silicon interface, thereby improving device reliability.

To etch the silicon dioxide layers, HF in various dilutions in water and often buffered with ammonium fluoride can be used. Silicon is etched in HF at a minuscule rate and thus provides an etch stop after an overlying oxide layer is etched. When using HF etchants the etching rate increases and decreases with etchant concentration. Increasing the temperature also increases the etch rate, with buffered solutions containing the etchants having a slightly higher activation energy.

Silicon nitride can be wet etched with either HF solutions or with hot phosphoric acid. Phosphoric acid is the "standard" wet nitride etch. In it, the nitride can etch more than 40 times as fast as CVD oxide, which is often used as a mask. The selectivity decreases at high temperatures, but in order to have useful etch rates, high-temperature boiling concentrated $H_3PO_4$ generally are used. For example, 91.5% $H_3PO_4$ boils at 180 degrees Celsius, etches high-temperature nitride at approximately 100 Angstroms/minute, and etches CVD oxide at about 10 Angstroms/minute. Under these same conditions, single-crystal silicon etches about 30% as fast as CVD oxide.

The remote plasma nitridation used in the invention can be carried out as follows. Nitridation can be performed at, for example, room-temperature by exposing a gate oxide to a short, high-density, remote helicon-based nitrogen discharge. Process conditions for the nitridation can be, for example, a process pressure of 2.7 to 12 mTorr, an input plasma power of 500 to 3000 W, and a durations of 3 to 90 s. In one embodiment of the present invention, a high density plasma discharge from a helicon-based nitrogen discharge is created using a plasma power of 1000 to 3000 watts. A power of 2000 watts can also be used. The chamber pressure can also be from 4 to 12 mTorr. Finally, a nitridation exposure time can be from about 10 to 90 seconds. In one embodiment, the nitridation exposure time was 20 seconds. The wafer can be supported on a ceramic ring (electrically floating) or, alternatively, on an electrostatic chuck (capacitively coupled to ground).

Post-nitridation annealing in an inert or low partial-pressure oxygen ambient can be performed using a furnace or rapid-thermal annealing. In one embodiment, the post-nitridation anneal is conducted in a controlled environment having, e.g., $N_2$, in an ambient or dilute ambient oxidation environment. Next, a rapid thermal anneal at 1000 degrees Centigrade for 60 seconds is conducted.

Depth profiling analysis can be performed on nitrided oxides with or without a 10 nm a-Silicon dioxide cap layer. Dynamic SIMS analysis can be performed using 1 keV Cs primary ion bombardment. Monitoring of CsSi+, CsO+, and CsN+ ions can be conducted to track [SI], [N] concentrations, respectively.

Separately, Time-of-flight SIMS (TOFSIMS), analysis can be performed using a 2 keV Ga+ primary ion bombardment, achieving 0.5–0.7 nm depth resolution within the top 5 nm of the dielectric film. Gallium, for example, can be selected as a primary ion source to minimize the pre-equilibrium effect nominally associated with Cs+ and O+ ion sources, allowing meaningful analysis of N and O concentrations from the top five angstroms. $Si_xN+$ and $Si_xO+$ ions can be used to track [N] and [O] as a function of depth. The nitrided layer 22 is created at a low temperature, which is generally described herein as less than 500 degrees Celsius. The thickness of the nitrided layer 22 can be varied by increasing the substrate bias on the wafer 10 during the silicon dioxide nitridation process, thereby allowing for the creation of a thicker or thinner nitrided layer 22. The thickness of the nitrided layer 22 can also be varied by increasing the length of the exposure to the nitrogen ion remote plasma. A combination of substrate bias and time can be adjusted to meet the demands of the manufacturing requirements of different circuits as will be known to those of skill in the art in light of the present disclosure.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A low temperature method of forming an opening through an oxide layer down to a silicon wafer surface without exposing the silicon wafer surface to contamination from photoresist stripping subsequent to completion of said opening to said wafer surface, said method comprising the steps of:

providing a silicon wafer having a surface containing a region of oxide on said surface;

exposing said region of oxide to a nitrogen ion containing plasma to form a nitrided layer on said region of oxide;

providing and patterning photoresist over said nitrided layer;

then etching said nitrided layer in accordance with the pattern of said photoresist on said nitrided layer with an etchant selective to the nitride relative to the oxide;

then removing all of said photoresist; and then etching said oxide down to the silicon beneath said oxide using said nitrided layer as a mask.

2. The method of claim 1, wherein said oxide is further defined as a silicon oxide and said oxide is at a temperature below 600 degrees Celsius during said step of exposing said oxide to a nitrogen ion containing plasma.

3. The method of claim 2, wherein said temperature is room temperature.

4. The method of claim 1, wherein said nitrogen ion plasma is created by a remote plasma.

5. The method of claim 1, wherein said step of exposing said oxide to a nitrogen ion containing plasma is further defined as occurring at between about 4 and about 12 mTorr.

6. The method of claim 1, wherein said step of exposing said oxide to nitrogen ion containing plasma is further defined as occurring at about 4 mTorr.

7. The method of claim 1, wherein said step of exposing said oxide to nitrogen ion containing plasma is further defined as occurring for between about 10 to about 90 seconds.

8. The method of claim 1, wherein said step of exposing said oxide to a nitrogen ion containing plasma is further defined as occurring for about 60 seconds.

9. The method of claim 1, wherein said step of exposing said oxide to a nitrogen ion containing plasma said plasma being further defined as being created at between about 1000 and about 3000 watts.

10. The method of claim 1, wherein said step of exposing said oxide to a nitrogen ion containing plasma said plasma being further defined as being created at about 2000 watts.

11. A low temperature method of forming an opening through an oxide layer down to a silicon wafer surface without exposing the silicon wafer surface to contamination from photoresist stripping subsequent to completion of said opening to said wafer surface, said method comprising the steps of:

providing a substrate;

forming an oxide layer on said substrate, said oxide layer having a surface; and exposing said oxide surface to nitrogen ions created by a remote plasma to form a nitrided layer on said oxide containing surface;

providing a patterned mask over said nitrided layer;

then removing portions of said nitrided layer in accordance with the pattern of said patterned mask with a nitride removing agent which is selective to the nitride as opposed to the oxide;

then removing all of said patterned mask; and then etching said oxide using the remaining nitride layer as a mask.

12. The method of claim 11, wherein said oxide is further defined as a silicon oxide and said oxide containing surface is at a temperature below 600 degrees Celsius during said step of exposing said oxide to a nitrogen ion containing plasma.

13. The method of claim 11, wherein said temperature is room temperature.

14. The method of claim 11, wherein said step of exposing said oxide to nitrogen ion containing plasma is further defined as occurring at between about 4 and about 12 mTorr.

15. The method of claim 11, wherein said step of exposing said oxide to a nitrogen ion containing plasma is further defined as occurring at about 4 mtorr.

16. The method of claim 11, wherein said step of exposing said oxide to a nitrogen ion containing plasma is further defined as occurring for between about 10 to 90 seconds.

17. The method of claim 11, wherein said step of exposing said oxide to a nitrogen ion containing plasma is further defined as occurring for about 60 seconds.

18. The method of claim 11, wherein said step of exposing said oxide to a nitrogen ion containing plasma said plasma being further defined as being created at between about 1000 and about 3000 watts.

19. The method of claim 11, wherein said step of exposing said oxide to a nitrogen ion containing plasma said plasma being further defined as being created at about 2000 watts.

20. The method of claim 11, wherein said substrate is further defined as having a substrate bias, said substrate bias affecting the rate of formation of said nitrided layer.

21. A low temperature method of forming an opening through an oxide layer down to a silicon wafer surface without exposing the silicon wafer surface to contamination from photoresist stripping subsequent to completion of said opening to said wafer surface, said method comprising the steps of:

providing a substrate;

forming an oxide layer on said substrate, said oxide layer having a surface; and exposing said oxide surface to nitrogen ions created by a remote plasma, to form a nitrided layer on said oxide surface;

forming a silicate layer on said nitrided layer;

providing a patterned photoresist on said silicate layer;

then dry etching said silicate layer to said nitrided layer in accordance with said pattern;

then wet etching said nitrided layer;

then stripping said photoresist; and then etching said oxide layer.

22. A low temperature method of forming an opening through an oxide layer down to a silicon wafer surface without exposing the silicon wafer surface to contamination from mask stripping subsequent to completion of said opening to said wafer surface, said method comprising the steps of:

providing a silicon wafer having a surface containing a region of oxide on said surface;

exposing said region of oxide to a nitrogen-containing source capable of forming a nitride with said oxide at a temperature below 600 degrees Celsius to form a nitrided layer on said oxide;

providing a patterned mask over said nitrided layer;

then removing said nitrided surface in accordance with the pattern of said mask on said nitrided layer to expose the oxide under the removed nitride;

then removing said mask; and then removing the exposed oxide down to the substrate using said nitrided layer as a mask for the oxide removal.

* * * * *